United States Patent [19]

Monk et al.

[11] Patent Number: 5,976,735
[45] Date of Patent: Nov. 2, 1999

[54] PHOTOPOLYMERISABLE COMPOSITION

[75] Inventors: Alan Stanley Victor Monk, Warrington; Peter Andrew Reath Bennett, Harrogate; Christopher David McCullogh; Geoffrey Horne, both of Leeds, all of United Kingdom

[73] Assignee: Kodak Polychrome Graphics LLC, Norwalk, Conn.

[21] Appl. No.: 08/615,293

[22] PCT Filed: Sep. 22, 1994

[86] PCT No.: PCT/GB94/02056

§ 371 Date: Mar. 21, 1996

§ 102(e) Date: Mar. 21, 1996

[87] PCT Pub. No.: WO95/09383

PCT Pub. Date: Apr. 6, 1995

[30] Foreign Application Priority Data

Sep. 28, 1993 [GB] United Kingdom ............... 9319961

[51] Int. Cl.[6] ..................................... G03F 7/029
[52] U.S. Cl. ................... 430/18; 430/281.1; 430/302; 430/283.1; 430/285.1; 430/287.1; 430/911; 430/906; 430/947; 430/919; 430/915; 430/926; 430/923; 430/945; 522/18; 522/28; 522/27; 522/26
[58] Field of Search ............... 430/281.1, 302, 430/911, 906, 947, 283.1, 919, 915, 926, 923, 285.1, 287.1, 18; 522/26, 18, 28, 27

[56] References Cited

U.S. PATENT DOCUMENTS 5,011,755  4/1991  Rohde et al. ........................ 430/18
5,229,253  7/1993  Zertani et al. ....................... 522/26 X
5,397,675  3/1995  Arimatsu et al. ..................... 430/175

FOREIGN PATENT DOCUMENTS 0276 016  7/1988  European Pat. Off. .
0497 552  8/1992  European Pat. Off. .
4-184344  7/1992  Japan .

OTHER PUBLICATIONS

Yamashita et al, 118: 136273 from Chemical Abstracts, ACS, English Abstract of JP04–184344 published Jul. 1, 1992.

Toyo Kogyo Co, 92–272226 Frow WPIDS F.[1]e, Derwent Information LTD, English Abstract of JP04–184344 published Jul. 7, 1992.

Primary Examiner—Cynthia Hamilton
Attorney, Agent, or Firm—Ostrager Chong Flaherty & Onofrio

[57] ABSTRACT

There is described a lithographic plate which comprises a base coated with a photopolymerisable composition which comprises a polymeric binder, at least one free-radically polymerisable ethylenically unsaturated compound and as the photoinitiator combination a metallocene compound, N-phenyl glycine or a substituted N-phenyl glycine or an N-phenyl glycine derivative together with a third component which is a substance which helps in the reaction initiation but also increases the sensitivity of the photopolymerisable composition to a desired region of the spectrum.

14 Claims, No Drawings

PHOTOPOLYMERISABLE COMPOSITION

OBJECT OF THE INVENTION

The use of photoinitiators to enhance the U.V. sensitivity of photopolymerisable compositions is well known and includes such compounds or mixtures as trihalomethyl substituted-S-triazines, 9-phenyl acridine, thioxanthones together with dialkylamino compounds, basic acridine compounds and halo-methyl triazines and bis acyl phosphine oxide compounds.

However recently materials which are photosensitive in the visible light regions as well as in the U–V regions are beginning to displace silver sensitised compositions. In particular photopolymerisable compositions which can be laser imaged are required. These compositions must have a high sensitivity and can be photosensitive up to about 550 nm.

Metallocene compounds have been described as photoinitiators for photopolymerisable mixture for example in U.S. Pat. No. 3,717,558. Other metallocenes and in particular titanocenes are described for this same use in E.P.A. 119162, 122223 and 186626. However such metallocenes are not particularly soluble in the solvent usually used to coat photopolymerisable compositions and furthermore are not particularly sensitive to visible light for example an argon ion laser.

We have found a lithographic plate which comprises a photopolymerisable composition which comprises a metallocene which is soluble in the solvents used to coat photopolymerisable compositions and which is sensitive to visible light.

SUMMARY OF THE INVENTION

According to the present invention there is provided a lithographic plate which comprises a base coated with a photopolymerisable composition which comprises a polymeric binder, at least one free-radically polymerisable ethylenically unsaturated compound and as the photoinitiator combination a metallocene compound N-phenyl glycine or a substituted N-phenyl glycine or an N-phenyl glycine derivative together with a third component which is a substance which helps in the reaction initiation but also increases the sensitivity of the photopolyinerisable composition to a desired region of the spectrum, and which is selected from compounds which comprise an acridine, phenazine or quinoxaline moiety, from dibenzalacetone or coumarines or which is a dye selected from xanthene, benzoxanthene, benzothioxanthene, thiazine, pyronine, porphyrin or acridine dyes.

The metallocene when light exposed generates free radicals which cause the polymerisable ethylenically unsaturated compound to polymerise. This reaction is speeded-up by the presence of the N-phenyl glycine compound. The presence of the third component also aids to increase the speed of polymerisation. The choice of this compound depends on the wavelength of the exposing source to be used.

If the composition is to be exposed to the near ultra-violet region of the spectrum then the third component of the composition useful compound are those which comprise an acridine, phenazine or quinoxaline moiety. Examples are acridine substituted in the 9 position, such as 9-phenyl-, 9-p-methoxyphenyl- or 9-acetylaminoacridine, or acridine derivatives having fused-on aromatic rings, for example benz[a]acridine. A suitable phenazine derivative is, for example, 9,10-dimethylbenz[a]phenazine. Suitable quinoxaline derivatives are in particular 2,3-diphenyl derivatives which are preferably further substituted in the two phenyl preferred. The amount of this component in the mixture is in the range from about 0 to about 10% by weight, preferably between about 0.05 and 5% by weight.

For sensitisation to the visible region compounds of the dibenzalacetone or coumarin type are particularly useful. Suitable representatives of these compounds are 4,4'-disubstituted dibenzalacetones, for example diethylamino-4'-methoxydibenzalacetone, or coumarin derivatives, such as 3-acetyl-7-diethylamino-, 3-benzimidazolyl-7-diethylamino- or carbonyl-bis(7-diethylaminocoumarin). The amount of these compounds in the mixture are in the range from 0 to about 10, preferably about 0.05 to 4% by weight.

Alternatively, many dye types are particularly useful for spectral sensitisation. Suitable dyes are in particular xanthene, benzoxanthene, benzothioxanthene, thiazine, pyronine, porphyrin or acridine dyes.

Suitable xanthene and thiazine dyes are described, for example, in EP-A 287,817. Suitable benzoxanthene and benzothioxanthene dyes are described in DE-A 2,025,291, and in EP-A 321,828.

An example of a suitable porphyrin dye is haematoporphyrin and an example of a suitable acridine dye is acriflavinium chloride hydrochloride.

Examples of xanthene dyes are Eosin B (C.I. No. 45400), Eosin J (.I. No. 45380), Eosin alcohol-soluble (C.I. 45386), Cyanosine (C.I. No. 45410), Rose Bengal, Erythrosine (C.I. No. 45430), 2,3,7-trihydoxy-9-phenylxanthen-6-one and Rhodamin 6 G (C.I. No. 45160).

Examples of thiazine dyes are thionine (C.I. No. 52000), Azure A (C.I. No. 52005) and Azure C (C.I. No. 52002).

Examples of pyronine dyes are Pyronin B (C.I. No. 45010) and Pyronin GY (C.I. No. 45005). The amount of these dyes is in general between about 0.01 and 10, preferably between about 0.05 and 4, % by weight, relative to the non-volatile portions of the mixture.

PREFERRED EMBODIMENTS

A desirable feature of the lithographic plate of the present invention that an oxygen inhibition means or an additive inhibitor is present in or on the lithographic plate when the photopolymerisable composition is imagewise exposed. In some circumstances if no oxygen inhibition-means or additive is present little photohardening of the photopolymerisable composition occurs.

Preferably the oxygen inhibition means is a coating of a water-soluble polymer such as polyvinyl alcohol over the photopolymerisable composition. This coating is removed during the development process. Alternatively but less usefully oxygen inhibition additives such as behenic acid are added to the photopolymerisable composition. When the composition is coated the behenic acid floats to the surface of the composition.

Another suitable oxygen inhibition means is a layer which is self supporting and which can be peeled off the plate after exposure and before development.

Suitable thicknesses of oxygen inhibiting layers are from 0.1 to 10 $\mu$m and preferably 1 to 5 $\mu$m.

However exposure to the plate in a vacuum frame obviates the need to provide oxygen inhibition.

The free-radically polymerisable ethylenically unsaturated compound or compounds contain at least one ethylenically unsaturated double bond per molecule. When free-radicals are generated by the photo-initiator composition these compounds polymerise to give higher molecular weight compounds which are insoluble in selected solvents.

Preferably two free-radically polymerisable unsaturated compounds are present in the photopolymerisable composition, one of which is an oligomer with acrylate functionality and the other of which is a monomer with acrylate functionality.

An example of a class of oligomers with acrylate functionality is a polyester with four acrylate groups.

Commercially available compound of this class are Ebecryls which are marketed by UCB, S.A. SPECIALITIES DIVISION, DROGENBOS, BELGIUM.

An example of a class of monomers with acrylate functionality is dipentaerythritol penta-acrylate. Certain Ebecryl compounds also fall within this class.

Polymeric binders for inclusion in the composition may have useful effects on solubility, film formation, photoreactivity and adhesive strength, and may be chosen according to the particular application. For example, a copolymer of acrylic acid (or methacrylic acid) and an alkyl acrylate (or methacrylate) such as the methyl, ethyl or butyl esters, itaconic acid copolymers, partially esterfied maleic acid copolymers, cellulose acetate derivatives having carboxyl substituents, poly(ethylene oxide) and poly(vinylpyrrolidone) are useful in aqueous processing systems.

Useful binders for the photopolymerisable composition are partially hydrolysed cellulose acetates or cellulose acetate-butyrate polymers. The partial hydrolysis is required to increase their water developability. Most preferably cellulose acetate-butyrates which have been reacted with an acrylamide to provide polymers with acrylate functionality are used.

However, the preferred binder combination for the photopolymerisable composition consists of a cellulose acetate butyrate, a cellulose acetate hydrogen pthalate and a polymer consisting of an acrylic backbone functionalised with pendent dimethylmaleiimide photoreactive groups.

Most preferably cellulose acetate butyrates which have been reacted with an acrylamide to provide polymer with acrylate functionality are used. U.S. Pat. No. 4,490,516 and U.S. Pat. No. 4,557,951 to the A. E. Staley Manufacturing Company describe such CAB polymers.

Most preferably the dimethylmalesmide containing polymer is R0300 manufactured by Rohner and known as Rohnercoat.

The preferred metallocenes are formed from elements of Group IVB of the periodic table for example titanium as described above and zirconium.

Titanocene compounds and their use as photoinitiators for the photopolymerisation of polymerisable ethylenically unsaturated compounds are described in a number of Ciba-Geigy A.G. patents including U.S. Pat. No. 4,590,287, U.S. Pat. No. 4,548,891 and EP 318894. Ciba-Geigy are the main suppliers of titanocenes for use as photoinitiators in photopolymerisable compositions.

Thus, particularly useful titanocene compounds include titanocenes having two optionally substituted cyclopentadienyl ligands and one or two unsubstituted or substituted 6-membered carbocyclic or 5- or 6-membered heterocyclic aromatic radicals attached to the titanium atom. In preferred compounds, the aromatic radicals have a fluorine substituent in at least one of the two ortho positions relative to the titanium-carbon bond and optionally have further substituents.

Substituents which may optionally be present on the cyclopentadiene rings include $C_1$–$C_{18}$-alkyl and alkoxy, especially $C_1$–$C_8$-cycloalkyl and cycloalkenyl, $C_6$–$C_{16}$-aryl, $C_7$–C16-aralkyl and halogen, for example chlorine. The same substituents may optionally be present on the carbocyclic or heterocyclic aromatic radicals as may also other substituents such as amino groups, especially tertiary amino groups which may optionally be quaternised and may be derived from heterocyclic amines such as pyrrolidine, piperidine, piperazine, N-methylpiperazine morpholine, pyrrole and pyridine.

Specific examples of useful titanocene compounds include bis(cyclopentadienyl)-bis[2,6-difluoro-3-(1-pyrrolyl)phenyl]-titanium available from Ciba-Geigy as CGI-784, bis(cyclopentadienyl)-bis (pentafluorophenyl)-titanium and bis(cyclopentadienyl)-bis(2,3,5,6-tetrafluoro-4-decyloxyphenyl)-titanium.

Suitable keto-coumarins for use in the present invention are described in U.S. Pat. No. 4,147,552 and in U.S. Pat. No. 4,278,751 assigned to Eastman Kodak Company.

Particularly useful keto-coumarins are carbonyl-bis amine substituted coumarins for example 3,3-carbonyl-bis-7-diethylaminocoumarin which sensitises the photopolymerisable composition to 488 nm. Certain dyes can be used to sensitise the photopolymerisable composition to longer wavelengths. For example ethyl eosin can be used to sensitise the composition to 532 nm.

The N-phenyl glycine used in the composition of the present invention has the formula I:

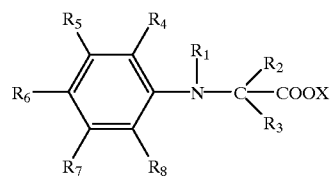

I where $R_1$ is a hydrogen, an alkyl group having 1 to 12 carbon atoms, a cycloalkyl group, a hydroxyalkyl group having 1 to 12 carbon atoms, a hydroxyalkoxyaryl group, an alkoxyalkyl group having 2 to 12 carbon atoms, a hydroxyalkyl ester, a hydroxyalkylaryl ester, an alkyl carboxylic acid or salts thereof, an aminoalkyl group leaving 1 to 12 carbon atoms, an aryl group or an alkyl acrylate or methacrylate group, $R_4$, $R_5$, $R_6$, $R_7$ and $R_8$ are each a hydrogen atom, an alkyl group having 1 to 12 carbon atoms or a halogen atom, or at least one $R_4$, $R_5$, $R_6$, $R_7$ and $R_8$ are a nitro or alkoxy group the remainder being hydrogen, $R_2$ and $R_3$ are each a hydrogen, a halogen atom or an alkyl group having 1 to 8 carbon atoms and X is hydrogen or an organic or inorganic cation.

Preferably each of $R_4$–$R_8$ is a hydrogen atom or $R_6$ is a halogen atom and the $R_4$, $R_5$, $R_7$ and $R_8$ are hydrogen atoms.

Preferably $R_2$, and $R_3$ are both hydrogen atoms.

Preferably $R_1$ is hydrogen or a lower alkyl group having 1 to 4 carbon atoms or a —$CH_2$—COOH group.

In a particularly useful compound $R_1$–$R_8$ are all hydrogen atoms, that is to say N-phenyl glycine, itself.

Thus the preferred lithographic plate of the present invention when the plate is to be laser exposed comprises two free-radically polymerisable compounds one of which is an oligomer with acrylate functionality and the other of which is a monomer with acrylate functionality, as a binder a mixture of a cellulose acetate butyrate, a cellulose acetate hydrogen phthalate and a polymer which comprises an acrylic backbone functionalised with pendent dimethylmaleiimide photoreactive groups, a titanocene having two optionally substituted cyclopentadienyl ligands and one or two unsubstituted 6-membered carbocylic or 5-or 6-membered positions relative to the titanium-carbon bond, a carbonyl-bis-amine substituted coumarin and N-phenyl glycine, there being present either oxygen inhibition means or an oxygen inhibition additive.

A large number of combinations of photoinitiators have been proposed both to increase the speed of a photosensitive composition for use in lithographic plates and also to increase the sensitivity of the composition into the visible so that the composition can be laser imaged.

For example U.S. Pat. No. 5,011,755 describes a photopolymerisable combination which comprises a titanocene and a ketocoumarin, E.P. application 497552 describes a photopolymerisable combination which comprises an N-phenyl glycine and a titanocene and U.S. Pat. No. 4278751 describes a photopolymerisable combination which comprises a ketocoumarin and certain acetic acid derivatives. However the photopolymerisable combination used in the lithographic plate of our invention exhibits a remarkable and unexpected increase in speed over the prior art combinations.

A suitable composition of the dried layer of the photopolymerisable composition is per 100 g of composition:

| | |
|---|---|
| binder | 70 g to 20 g |
| oligomer | 80 g to 20 g |
| monomer | 80 g to 20 g |
| titanocene | 15 g to 0.5 g |
| third component | 10 g to 1 g |
| N-phenyl glycine or derivative | 10 g to 1 g |

Optionally a suitable pigmented resin or dye may also be present in the composition and this may be present to the extent of from 20 g to 2 g per 100 g of the composition.

A useful solvent from which to coat the composition is for example a mixture of glycol ethers and dimethyl formamide.

There may be present in the composition, in addition to the already listed ingredients inhibitors to prevent thermal polymerisation of the composition, indicators and plasticisers. Only a small amount of such additives are present if any so as to absorb as little as possible of the exposing light.

Suitable support materials for the lithographic plates according to the invention are, for example, aluminium, steel, zinc and copper foils, plastics films, for example polyethylene terephthalate or cellulose acetate films, and support materials for screen printing, such as Perlon gauze. It is in many cases advantageous to subject the surface of the support material to a pretreatment (electro chemical thermal or mechanical) with the aim of correctly adjusting the adhesion of the layer, improving the lithographic properties of the surface of the support material, or reducing the reflectivity of the support material in the actinic region of the copying layer (anti-halation).

The photosensitive materials are fabricated in a conventional manner. For instance, it is possible to take up the layer constituents in a solvent, to apply the solution or dispersion to the intended support material by casting, spraying, dipping, roller coating and the like, and then to dry.

Owing to the broad spectral sensitivity of the polymerisable composition according to the invention which can be achieved, it is possible to use any light source familiar to those skilled in the art, for example fluorescent tubes, pulsed xenon lamps, metal-halide-doped high-pressure mercury vapor lamps and carbon arc lamps. In addition, it is possible to expose the lithographic plates of the invention in conventional projection and magnification equipment with the light from metal filament lamps and by contact exposure with customary incandescent lamps. Exposure can also be effected with the light of a laser.

Suitable for the purposes of the present invention are lasers of appropriate power, for example the argon ion laser, which emits at 488 nm. The laser beam can be controlled by means of a preprogrammed linewise scanning movement.

To develop the photopolymerisable compositions they are treated with a suitable developer solution, for example with organic solvents, but preferably with a neutral or weakly alkaline aqueous solution, which serves to remove the unexposed areas of the layer, leaving behind the exposed areas of the copying layer on the support material. The developer solutions may contain a small amount, preferably less than 5% by weight, of water-miscible organic solvents. They may further contain wetting agents, dyes, salts and other additives. In the course of development, the entire cover layer if present is removed together with the unexposed areas of the photopolymerizable layer.

The accompanying Examples will serve to illustrate the invention.

EXAMPLE 1

The following photopolymerisable composition was prepared in which the binder was the modified cellulose acetate butyrate as prepared in Example 6 of U.S. Pat. No. 4,557,951 which had been hydrolysed by reaction with sodium carbonate/bicarbonate.

| | parts by weight |
|---|---|
| Binder | 40 |
| Ebecryl 140 | 30 |
| Ebecryl 1290 | 30 |
| Blue chip resin solution | 3 |
| Photoinitiators | 9 |
| Dimethyl formamide (Solvent) | 22.10 |

Seven compositions were prepared each having a different photoinitiator mixture as set forth in Table A below.

The titanocene used in all the composition was Ciba-Geigy's CGI-784. The ketocoumarin used in all the composition had the formula:

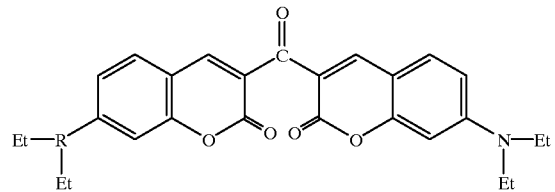

N-phenyl glycine itself was used.

All the compositions were easily soluble in the dimethyl formamide. They were coated by bar coating on 0.3 mm grained and anodised aluminium plate at a dry coating weight of 1 g/m After coating and drying they were supercoated with an aqueous solution of polyvinyl alcohol to provide a coating weight of at least 1 $g/m^2$ as an oxygen inhibition coating.

All the lithographic plates were imagewise exposed to an air cooled argon ion laser beam in an imagesetter at a wavelength of 488 nm. Each plate was exposed for sufficient time to polymerise the image area of the plate to achieve optimum image reproduction. These plates were then developed in a solution of sodium hexyl sulphate at 20° C. for one minute. The energy in micro-joules per cm² of plate to achieve this polymerisation was then derived. The lower the required energy the higher the sensitivity of the plate.

TABLE A

| COMPOSITION | PHOTOINITIATOR MIXTURE | | | SENSITIVITY (PER/CM²) |
|---|---|---|---|---|
| | KETOCOUMARIN PARTS | TITANOCENE PARTS | N-PHENYL GLYCINE PARTS | |
| 1 | 9 | — | — | SIGNIFICANTLY GREATER THAN 380 |
| 2 | — | 9 | — | 380 |
| 3 | — | — | 9 | SIGNIFICANTLY GREATER THAN 380 |
| 4 | 4.5 | 4.5 | — | 160 |
| 5 | 4.5 | — | 4.5 | 380 |
| 6 | — | 4.5 | 4.5 | 160 |
| 7 | 3 | 3 | 3 | 85 |

These results show that the lithographic plate coated with composition 7, that is to say the lithographic plate according to the present invention was very much more sensitive than the plates coated with the other compositions.

Another plate was prepared coated with composition 7 but no supercoating with polyvinyl alcohol was carried out. In this case after prolonged exposure to the laser beam an attempt was made to develop an image using the development step as just set forth but no image was obtained and all the coating was washed off during the development step showing that no hardening had taken place due to the presence of oxygen.

EXAMPLE 2

The following photopolymerisable composition was prepared in which the binder was 19.25 parts of the modified cellulose acetate-butyrate as prepared in Example 6 of U.S. Pat. No. 4,557,951 1.5 parts of cellulose acetate hydrogen phthalate and 19.25 parts of the polymer R0300 from Rohner.

| | parts by weight |
|---|---|
| Binder | 40 |
| Ebecryl 140 | 30 |
| Ebecryl 1290 | 30 |
| Blue chip resin solution | 3 |
| Photoinitiators | 9 |
| Dimethyl formamide (Solvent) | 22.10 |

Seven compositions were prepared each having a different photoinitiator mixture as set forth in Table B below.

The titanocene used in all the composition was Ciba-Geigy's CGI-784. The ketocoumarin used in all the composition had the formula as the ketocoumarin used in Example 1.

N-phenyliminoacetic acid was used instead of the N-phenyl glycine used in Example 1. This compound is hereinafter referred to as PIDA.

All the compositions were easily soluble in the dimethyl formamide. They were coated by bar coating on 0.3 mm grained and anodised aluminium plate at a dry coating weight of 1 g/m².

After coating and drying they were supercoated with an aqueous solution of polyvinyl alcohol to provide a coating weight of at least 1 g/m² as an oxygen inhibition coating.

All the lithographic plates were imagewise exposed to the light of a 100 W Quartz-Halogen lamp at a distance of 75 cm, the light being filtered using an interference filter at 488 nm, providing an incident illumination of 75 lux at the plate surface. The plate was exposed under a 21-step Stouffer wedge having density increments of 0.15 for 60 seconds. These plates were then developed in a solution of Rewopal BN13 at 20° C. for one minute. The non-exposed areas were removed by this process. The highest solid step on the wedge was then determined. The higher the solid wedge reading the higher the sensitivity of the plate.

TABLE B

| COMPOSITION | PHOTOINITIATOR MIXTURE | | | SOLID WEDGE READING |
|---|---|---|---|---|
| | KETOCOUMARIN PARTS | TITANOCENE PARTS | PIDA PARTS | |
| 8 | 9 | — | — | NO IMAGE |
| 9 | — | 9 | — | 0.5 |
| 10 | — | — | 9 | NO IMAGE |
| 11 | 4.5 | 4.5 | — | NO IMAGE |

TABLE B-continued

| COMPOSITION | PHOTOINITIATOR MIXTURE | | | SOLID WEDGE READING |
|---|---|---|---|---|
| | KETOCOUMARIN PARTS | TITANOCENE PARTS | PIDA PARTS | |
| 12 | 4.5 | — | 4.5 | NO IMAGE |
| 13 | — | 4.5 | 4.5 | 1 |
| 14 | 3 | 3 | 3 | 2 |

These results show that the lithographic plate coated with composition 14, that is to say the lithographic plate according to the present invention was very much more sensitive than the plates coated with the other compositions.

EXAMPLE 3

The following photopolymerisable composition was prepared in which the binder was that used in Example 2.

| | parts by weight |
|---|---|
| Binder | 40 |
| Ebecryl 140 | 30 |
| Ebecryl 1290 | 30 |
| Blue chip resin solution | 3 |
| Photoinitiators | 9 |
| Dimethyl formamide (Solvent) | 22.10 |

Seven compositions were prepared each having a different photoinitiator mixture as set forth in Table C below.

The titanocene used in all the composition was Ciba-Geigy's CGI-784. The ketocoumarin used in all the composition was the ketocoumarin used in Example 1.

N-phenyl glycine itself was used.

All the compositions were easily soluble in the dimethyl formamide. They were coated by bar coating on 0.3 mm grained and anodised aluminium plate at a dry coating weight of 1 g/m².

After coating and drying they were supercoated with an aqueous solution of polyvinyl alcohol to provide a coating weight of at least 1 g/m as an oxygen inhibition coating.

All the lithographic plates were imagewise exposed and developed as in Example 2.

EXAMPLE 4

The following photopolymerisable composition was prepared in which the binder was that used in Example 2.

| | parts by weight |
|---|---|
| Binder | 40 |
| Ebecryl 140 | 30 |
| Ebecryl 1290 | 30 |
| Blue chip resin solution | 3 |
| Photoinitiators | 9 |
| Dimethyl formamide (Solvent) | 22.10 |

Seven compositions were prepared each having a different photoinitiator mixture as set forth in Table D below.

The titanocene used in all the composition was Ciba-Geigy's CGI-784.

The ketocoumarin used in all the composition was that used in Example 1.

The N-phenyl glycine derivative was N-(2-hydroxypropyl-4-methoxy phenyl ether)-N-phenyl glycine hereinafter referred to as NPG/0. This compound has the formula:

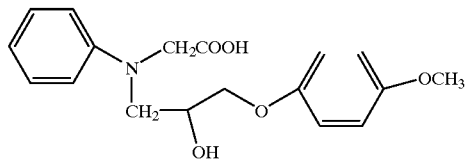

All the compositions were easily soluble in the dimethyl formamide. They were coated by bar coating on 0.3 mm grained and anodised aluminium plate at a dry coating weight of 1 g/m².

After coating and drying they were supercoated with an aqueous solution of polyvinyl alcohol to provide a coating weight of at least 1 g/m² as an oxygen inhibition coating.

TABLE C

| COMPOSITION | PHOTOINITIATOR MIXTURE | | | SOLID WEDGE READING |
|---|---|---|---|---|
| | KETOCOUMARIN PARTS | TITANOCENE PARTS | N-PHENYL GLYCINE PARTS | |
| 8 | 9 | — | — | NO IMAGE |
| 9 | — | 9 | — | 0.5 |
| 15 | — | — | 9 | NO IMAGE |
| 11 | 4.5 | 4.5 | — | 2 |
| 16 | 4.5 | — | 4.5 | 1 |
| 17 | — | 4.5 | 4.5 | 1 |
| 18 | 3 | 3 | 3 | 3 |

These results show that the lithographic plate coated with composition 18, that is to say the lithographic plate according to the present invention was very much more sensitive than the plates coated with the other compositions.

All the lithographic plates were imagewise exposed and developed as in Example 2.

TABLE D

| | PHOTOINITIATOR MIXTURE | | | |
|---|---|---|---|---|
| COMPOSITION | KETOCOUMARIN PARTS | TITANOCENE PARTS | NPG/O PARTS | SOLID WEDGE READING |
| 8 | 9 | — | — | NO IMAGE |
| 8 | 9 | — | — | NO IMAGE |
| 9 | — | 9 | — | 0.5 |
| 19 | — | — | 9 | NO IMAGE |
| 11 | 4.5 | 4.5 | — | 2 |
| 20 | 4.5 | — | 4.5 | TRACE IMAGE |
| 21 | — | 4.5 | 4.5 | 1 |
| 22 | 3 | 3 | 3 | 4 |

These results show that the lithographic plate coated with composition 22, that is to say the lithographic plate according to the present invention was very much more sensitive than the plates coated with the other compositions.

EXAMPLE 5

The following photopolymerisable composition was prepared in which the binder was a copolymer of methyl methacrylate, hydroxymethyl methacrylate and acrylic acid.

Seven compositions were prepared each having a different photoinitiator mixture as set forth in Table E below.

| | parts by weight |
|---|---|
| Binder | 40 |
| Ebecryl 140 | 30 |
| Ebecryl 1290 | 30 |
| Blue chip resin Solution | 3 |
| Photoinitiators as set forth in Table E | |
| Dimethyl formamide (solvent) | 22.10 |

The lithographic plates obtained were exposed to the light of a 100 W Quartz-Halogen lamp at a distance of 52 cm, the light being filtered using an interference filter at 532 nm, providing an incident illumination of 200 lux at the plate surface. The plates were placed under vacuum, provided by a standard lithographic print down frame, and exposed under a 21-step Stouffer wedge having density increments of 0.15 for 30 minutes. These plates were then developed in a solution of Rewopal BN13 at 20° C. for one minute. The non-exposed areas were removed by this process. The highest solid step on the wedge was then determined. The higher the solid wedge reading the higher the sensitivity of the plate.

TABLE E

| COMPOSITION | ERYTHROSIN B PARTS | TITANOCENE PARTS | N-PHENYL GLYCINE PARTS | WEDGE READING |
|---|---|---|---|---|
| 23 | 1 | — | — | NO IMAGE |
| 24 | — | 6 | — | NO IMAGE |
| 25 | — | — | 3 | NO IMAGE |
| 26 | 1 | 6 | — | NO IMAGE |
| 27 | 1 | — | 3 | NO IMAGE |
| 28 | — | 6 | 3 | TRACE IMAGE |
| 29 | 1 | 6 | 3 | 1 |

The titanocene used was Ciba-Geigy's CGI-784 as used in Example 1.

N-phenyl glycine itself was used.

Instead of a ketocoumarin there was used the dye Erythrosin B(CI No 45430.2). This dye sensitises the photopolymerisable composition to 532 nm which is significantly higher than 488 nm which is the wavelength to which the ketocoumarin sensitised the compositions in Examples 1 to 4.

All the compositions were easily soluble in dimethyl formamide. They were coated by bar coating on 0.3 mm grained and anodised aluminium plate at a dry coating weight of 1 g/m².

These results show that the lithographic plate coated with composition 29, that is to say the lithographic plate according to the present invention was very much more sensitive than the plates coated with the other compositions.

We claim:

1. A lithographic plate which comprises a base coated with a photopolymerisable composition which comprises:

a polymeric binder which is partially hydrolysed cellulose acetates, cellulose actetate-butyrate polymers, cellulose acetate-butyrate polymers reacted with an acrylamide to provide acrylate functionality, combination of cellulose acetate butyrate, cellulose acetate hydrogen phthalate, and polymers including an acrylic backbone functionalised with dimethylmaleiimide photoreactive groups, or mixtures thereof;

at least one free-radically polymerisable ethylenically unsaturated compound; and a photoinitiator combination comprising:
(i) a metallocene compound,
(ii) a N-phenyl glycine compound of the general formula:

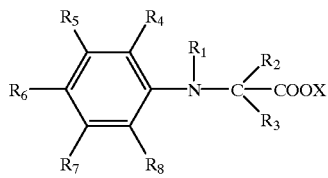

where $R_1$ is a hydrogen, an alkyl group having 1 to 12 carbon atoms, a cycloalkyl group, a hydroxyalkyl group having 1 to 12 carbon atoms, a hydroxyalkoxyaryl group, an alkoxyalkyl group having 2 to 12 carbon atoms, a hydroxyalkyl ester, a hydroxyalkylaryl ester, an alkyl carboxylic acid or salts thereof, an aminoalkyl group having 1 to 12 carbon atoms an aryl group or an alkyl acrylate or methacrylate group, $R_4$, $R_5$, $R_6$, $R_7$ and $R_8$ are each a hydrogen atom, an alkyl group having 1 to 12 carbon atoms, or a halogen atom, or at least one $R_4$, $R_5$, $R_6$, $R_7$ and $R_8$ are a nitro or alkoxy group the remainder being hydrogen, $R_2$, $R_3$ are each a hydrogen, a halogen atom or an alkyl group having 1 to 8 carbon atoms and X is hydrogen or an organic or inorganic cation; and (iii) a third component which is a substance which helps in the reaction initiation but also increases the sensitivity of the photopolymerisable composition to a desired region of the spectrum, wherein said third component is a compound selected from the group consisting of dibenzalacetones, coumarines, xanthene dyes, benzoxanthene dyes, benzothioxanthene dyes, thiamine dyes, pyronine dyes, porphyrin dyes and acridine dyes.

2. A lithographic plate according to claim 1 which also comprises an oxygen inhibition means or additive.

3. A lithographic plate according to claim 1 wherein said metallocene compound is a titanocene.

4. A lithographic plate according to claim 3 wherein said titanocene has two optionally substituted cyclopentadienyl ligands and one or two unsubstituted 6-membered carbocyclic or 5- or 6-membered heterocyclic aromatic radicals attached to the titanium atom, the aromatic radicals having a fluorine substituent in at least two or three positions relative to the titanium-carbon bond.

5. A lithographic plate according to claim 1 wherein said coumarin is a carbonyl-bis-amine substituted coumarin.

6. A lithographic plate according to claim 1 wherein said xanthene dye is an eosin dye.

7. A lithographic plate according to claim 1 where in said general formula each of $R_4$–$R_8$ is a hydrogen atom or $R_6$ is a halogen atom and $R_4$, $R_5$, $R_7$ and $R_8$ are hydrogen atoms.

8. A lithographic plate according to claim 1 wherein said general formula $R_2$ and $R_3$ are both hydrogen atoms.

9. A lithographic plate according to claim 1 wherein said general formula $R_1$ is hydrogen or a lower alkyl group having 1 to 4 carbon atoms or a —$CH_2$—COOH group.

10. A lithographic plate according to claim 1 wherein two free radically polymerisable ethylenically unsaturated compounds are present, one of which is an oligomer with acrylate functionality and the other of which is a monomer with acrylate functionality.

11. A printing plate which has been prepared by imagewise exposing and developing a lithographic plate as claimed in claim 1.

12. A lithographic plate which comprises;
two free-radically polymerisable compounds one of which is an oligomer with acrylate functionality and the other of which is a monomer with acrylate functionality;
a polymeric binder comprising a partially hydrolysed cellulose acetate-butyrate polymer which has been reacted with an acrylamide to provide acrylate functionality; and
a photoinitiator combination comprising:
(i) a metallocene compound comprising a titanocene having two optionally substituted cyclopentadienyl ligands and one or two unsubstituted 6-membered carbocylic or 5- or 6-membered heterocyclic aromatic radicals attached to the titanium atom, the aromatic radicals having a fluorine substituent in at least two or three positions relative to the titanium-carbon bond;
(ii) a N-phenyl glycine compound of the general formula:

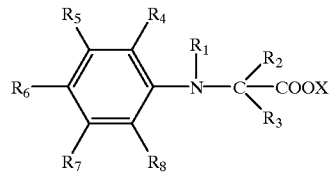

where $R_1$ is a hydrogen, an alky group having 1 to 12 carbon atoms, a cycloalkyl group, a hydroxyalkyl group having 1 to 12 carbon atoms, a hydroxyalkoxyaryl group, an alkoxyalkyl group having 2 to 12 carbon atoms, a hydroxyalkyl ester, a hydroxyalkylaryl ester, an alkyl carboxylic acid or salts thereof, an aminoalkyl group having 1 to 12 carbon atoms an aryl group or an alkyl acrylate or methacrylate group, $R_4$, $R_5$, $R_6$, $R_7$ and $R_8$ are each a hydrogen atom, an alkyl group having 1 to 12 carbon atoms, or a halogen atom, or at least one $R_4$, $R_5$, $R_6$, $R_7$ and $R_8$ are a nitro or alkoxy group the remainder being hydrogen, $R_2$, $R_3$ are each a hydrogen, a halogen atom or an alkyl group having 1 to 8 carbon atoms and X is hydrogen or an organic or inorganic cation; and (iii) a third component which is a substance which helps in the reaction initiation but also increases the sensitivity of the photopolymerisable composition to a desired region of the spectrum, wherein said third component is a compound selected from the group consisting of dibenzalacetones, coumarines, xanthene dyes, benzoxanthene dyes, benzothioxanthene dyes, thiazine dyes, pyronine dyes, porphyrin dyes and acridine dyes; and there being present either oxygen inhibition means or an oxygen inhibition additive.

13. A lithographic plate which comprises:
two free-radically polymerisable compounds one of which is an oligomer with acrylate functionality and the other of which is a monomer with acrylate functionality;
a polymeric binder comprising a mixture of a cellulose acetate butyrate, a cellulose acetate hydrogen phthalate and a polymer which comprises an acrylate backbone functionalised with dimethylmaleiimide photoreactive groups; and a photoinitiator combination comprising:
(i) a metallocene compound comprising a titanocene having two optionally substituted cyclopentadienyl ligands and one or two unsubstituted 6-membered carbocylic or 5- or 6-membered heterocyclic aromatic radicals attached to the titanium atom, the aromatic radicals having a fluorine substituent in at least two or three positions relative to the titanium-carbon bond;
a N-phenyl glycine compound of the general formula:

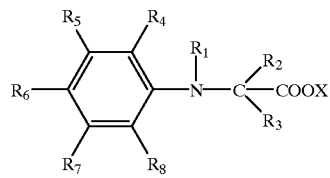

where $R_1$ is a hydrogen, an alky group having 1 to 12 carbon atoms, a cycloalkyl group, a hydroxyalkyl group having 1 to 12 carbon atoms, a hydroxyalkoxyaryl group, an alkoxyalkyl group having 2 to 12 carbon atoms, a hydroxyalkyl ester, a hydroxyalkylaryl ester, an alkyl carboxylic acid or salts thereof, an aminoalkyl group having 1 to 12 carbon atoms an aryl group or an alkyl acrylate or methacrylate group, $R_4$, $R_5$, $R_6$, $R_7$ and $R_8$ are each a hydrogen atom, an alkyl group having 1 to 12 carbon atoms, or a halogen atom, or at least one $R_4$, $R_5$, $R_6$, $R_7$ and $R_8$ are a nitro or alkoxy group the remainder being hydrogen, $R_2$, $R_3$ are each a hydrogen, a halogen atom or an alkyl group having 1 to 8 carbon atoms and X is hydrogen or an organic or inorganic cation; and
(iii) a third component which is a substance which helps in the reaction initiation but also increases the sensitivity of the photopolymerisable composition to a desired region of the spectrum, wherein said third component is a compound selected from the group consisting of dibenzalacetones, coumarines, xanthene dyes, benzoxanthene dyes, benzothioxanthene dyes, thiazine dyes, pyronine dyes, porphyrin dyes and acridine dyes; and there being present either oxygen inhibition means or an oxygen inhibition additive.

14. A lithographic plate for laser exposure which comprises:

two free-radically polymerisable compounds one of which is an oligomer with acrylate functionality and the other of which is a monomer with acrylate functionality, a polymeric binder comprising a mixture of a cellulose acetate butyrate, a cellulose acetate hydrogen phthalate and a polymer which comprises an acrylic backbone functionalised with pendent dimethylmaleiimide photoreactive groups, a photoinitiator combination comprising:
(i) a metallocene compound comprising a titanocene having two optionally substituted cyclopentadienyl ligands and one or two unsubstituted 6-membered carbocylic or 5- or 6-membered heterocyclic aromatic radicals attached to the titanium atom, the aromatic radicals having a fluorine substituent in at least two or three positions relative to the titanium-carbon bond,
(ii) a N-phenyl glycine compound selected from the group consisting of N-phenyl glycine, N-phenyliminoacetic acid, and N-(2-hydroxypropyl-4-methoxy phenylether)-N-phenyl glycine; and
(iii) a third component which is a substance which helps in the reaction initiation but also increases the sensitivity of the photopolymerisable composition to a desired region of the spectrum wherein said third component is a compound is a carbonyl-bis-amine substituted coumarin;

there being present either oxygen inhibition means or an oxygen inhibition additive.

* * * * *